United States Patent
Gorman (10) Patent No.: US 6,567,026 B1
(45) Date of Patent: May 20, 2003

(54) VOLTAGE SCALING DIGITAL-TO- ANALOG CONVERTER WITH IMPEDANCE STRINGS

(75) Inventor: Christopher Matthew Gorman, Killala (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/990,584

(22) Filed: Nov. 21, 2001

Related U.S. Application Data (63) Continuation of application No. 09/602,357, filed on Jun. 22, 2000, now abandoned.

(51) Int. Cl.[7] .............................................. H03M 1/78
(52) U.S. Cl. ...................... 341/154; 341/144; 341/136; 341/145; 341/172
(58) Field of Search ................................ 341/154, 145, 341/153, 144, 156, 136

(56) References Cited

U.S. PATENT DOCUMENTS

| | | | | |
|---|---|---|---|---|
| 5,469,164 A | * | 11/1995 | Kemp | 341/145 |
| 5,495,245 A | * | 2/1996 | Ashe | 341/145 |
| 6,144,331 A | * | 11/2000 | Jiang | 341/150 |
| 6,163,289 A | * | 12/2000 | Ginetti | 341/145 |
| 6,201,491 B1 | | 3/2001 | Brunolli et al. | |
| 6,384,762 B2 | * | 5/2002 | Brunolli et al. | 341/144 |

OTHER PUBLICATIONS

Jacob Millman and Arvin Grabel, MicroElectronics, Copyright 1987 by McGraw–Hill, Inc. Second Edition.*

* cited by examiner

*Primary Examiner*—Michael Tokar
*Assistant Examiner*—Lam Mai
(74) *Attorney, Agent, or Firm*—Wolf, Greenfield & Sacks, PC (57) ABSTRACT

A DAC (1) comprises a pair of outer strings (4,5) of resistors Ra and Rb and an inner string (12) of resistors Rc connected in series with the outer string (4,5). The inner string (12) converts the LSBs, while the outer strings convert the MSBs. Outer switch networks (10,11) of switches Sa and Sb selectively switch the outer strings (4,5) to reference voltage terminals $V_{ref+}$ and $V_{ref-}$ (8,9) for selectively coupling selected portions of the outer strings (4,5) to the respective voltage reference terminals (8,9) for decrementing the inner string (12) in steps corresponding to one MSB between the terminals (8,9). An inner switch network (15) of switches Sc selectively connects an analog output terminal (2) to one of the resistors Rc; corresponding to the LSBs so that the analog voltage on the output terminal corresponds to the digital input signal.

28 Claims, 8 Drawing Sheets

VOLTAGE SCALING DIGITAL-TO-ANALOG CONVERTER WITH IMPEDANCE STRINGS

This is a Continuation of application Ser. No. 09/602,357, filed Jun. 22, 2000, now abandoned.

BACKGROUND TO THE INVENTION

1. Field of the Invention

The present invention relates to a digital-to-analog converter (DAC), and in particular, to a voltage-scaling DAC.

2. Description of the Prior Art

DACs can, in general, be categorised as current-scaling, voltage-scaling or charge-scaling devices. A general discussion of DACs is provided in Grebene, Bipolar and MOS Analog Integrated Circuit Design. Jon Wiley & Sons, 1984, pp. 753 to 824.

Some voltage-scaling DACs produce an analog output voltage by selectively tapping a voltage divider resistor or other impedance string connected between the high and low terminals of a reference voltage, with the low terminal, generally being set at ground potential. These types of converters are commonly used as building blocks in MOS analog-to-digital conversion systems, where they function as the DAC subsection of a successive-approximation-type analog-to-digital converter. For an N-bit voltage-scaling DAC, a single resistor string comprising $2^N$ identical resistors connected in series, is used as a potentiometer in which the voltage levels between successive resistors are sampled by means of binary switches. Replacing mechanical potentiometers and rheostats is an important and potentially very high volume application for these devices.

An alternative type of N-bit DAC which operates on the voltage-scaling principle is disclosed in U.S. Pat. No. 5,495,245 of Ashe. In the DAC of this U.S. specification; a pair of outer strings of series connected identical resistors are connected to respective reference voltage terminals. An inner string of equal value series connected resistors is connected at its respective opposite ends through a network of discrete outer switches to the respective outer strings. The outer switches are controlled by a decoder for moving the voltage applied across the inner string through the outer strings upwardly and downwardly within the range of the reference voltage. An analog output is selectively coupled through a network of inner switches to nodes between adjacent pairs of resistors of the inner string. The inner string of resistors corresponds to the least significant bits (LSBs) of the digital input signal, while the outer strings of resistors each correspond to the most significant bits (MSBs) of the digital input signal. Thus, the sum of the resistances of the inner string of resistors is equal to the value of one of the resistors of the outer strings. The decoder operates the inner switches for determining the analog output voltage corresponding to the LSBs of the digital input signal, while the decoder operates the outer switches for determining the analog output voltage corresponding to the MSBs of the digital input signal. The digital input signal is divided into an equal number of LSBs and MSBs. Thus, for an N-bit DAC where each voltage increment on the inner string corresponds to one LSB, for every $2^{N/2}$ voltage increments, the position of the inner string is moved along the outer strings by one increment on the outer strings, which corresponds to one MSB. This is achieved by switching the appropriate switches of the outer switch networks. The switches of the outer switch networks typically are P and N-type, MOSFETs which are driven in anti-phase.

The DAC of this U.S. Specification suffers from a differential non-linearity (DNL) error every $2^{N/2}$ codes of the digital input signal. In other words, the analog voltage output becomes non-linear each time the outer switches switch the inner string along the outer strings for each MSB. This results from the fact that the on-resistances of the respective switches of the outer switch networks vary with voltage level applied to the switches. The switches of the outer switch networks being MOS transistor switches, they have an inherent on-resistance, which varies with voltage level. Thus, even where the switches of the outer switch networks are kept as similar as possible to each other with their on-resistances being substantially similar, a differential non-linearity error still occurs every $2^{N/2}$ codes of the digital input signal, since each of the switches of the outer switch networks is subjected to a different voltage level (due to the fact that the reference voltage is fed to the switches of the outer switch networks through the corresponding outer strings). In order to minimize this error, the switches of the outer switch networks have to be made relatively large in order to minimize their on-resistances so as to, in turn, minimize the variation in on-resistance resulting from voltage variation. This is undesirable, since it leads to an excessive space requirement on the integrated circuit chip.

There is therefore a need for DAC which minimises the effect of the on-resistance of switches of a switch network of a DAC.

SUMMARY OF THE INVENTION

According to the invention, there is provided a digital-to-analog converter (DAC) for an N-bit digital input signal comprising a pair of voltage reference terminals for receiving a reference voltage, an analog output terminal on which an analog output voltage derived from the reference voltage is developed, first and second separate outer impedance strings of respective series connected impedance means defining a plurality of input taps, first and second outer switch means for selectively coupling a selected one of the input taps of each of the corresponding first and second outer impedance string to a corresponding one of the reference voltage terminals, an inner impedance string of respective series connected impedance means defining a plurality of output taps, the inner impedance string being connected in series with and between the respective first and second outer impedance strings, an inner switch means for selectively coupling the output terminal to a selected one of the output taps, and a control means responsive to the digital input signal for controlling the respective outer switch means for switching selectable portions of the corresponding outer impedance strings with the inner impedance string across the reference voltage terminals and for controlling the inner switch means for switching the output terminal to one of the output taps of the inner impedance string so that a voltage is developed on the output terminal corresponding to the digital input signal, the aggregate resistance of the portions of the outer impedance strings switched across the reference voltage terminals being substantially constant over the switching range, and the voltage level developed at the junction of the inner impedance string to one of the outer Impedance strings corresponding to one of the most significant bits (MSBs) and the least significant bits (LSBs) of the digital Input signal, and the voltage developed across the output terminal and the said junction of the inner impedance string with the said one of the outer impedance strings corresponding to the other of the MSBs and the LSBs of the digital input signal.

In one embodiment of the invention the respective first and second outer switch means comprise respective first and second outer switch networks, each switch network comprising a plurality of outer discrete switches, the number of switches in the respective outer networks corresponding to the number of input taps in the corresponding outer impedance string for individually coupling the respective corresponding input taps to the corresponding reference voltage terminal.

Preferably, the switches of the respective first and second outer switch networks are substantially identical to each other in the respective switch networks. Ideally, the switches of the respective first and second outer switch networks are all substantially identical to each other.

In one embodiment of the invention each switch of the respective first and second outer switch networks is provided by a P-type MOSFET and an N-type MOSFET driven in anti-phase. Alternatively, each switch of the respective first and second outer switch networks is provided by a single MOSFET type device.

Preferably, the first and second outer impedance strings each comprise equal numbers of impedance means, of substantially equal impedance values.

Preferably, the impedance means of the inner impedance string are of substantially equal impedance values.

In one embodiment of the invention the inner switch means comprises an inner switch network comprising a plurality of discrete switches, the number of discrete switches corresponding to the number of output taps on the inner impedance string for individually coupling the respective output taps to the output terminal.

Preferably, the switches of the inner switch network are substantially identical to each other.

In one embodiment of the invention, each switch of the inner switch network is provided by a P-type MOSFET and an N-type MOSFET driven in anti-phase. Alternatively, each switch of the inner switch network is provided by a single MOSFET type device.

In one embodiment of the invention each impedance string which corresponds to the LSBs comprises $2^M$ impedance means, where M is the number of least significant bits in the digital input signal.

Preferably, each impedance string which corresponds to the MSBs comprises $2^{(N-M)}-1$ impedance means, where N is the number of bits in the digital input signal.

Advantageously, the impedance value of each impedance means in each impedance string corresponding to the LSBs is $\frac{1}{2}^M$ of the Impedance value of each impedance means in each impedance string corresponding to the MSBs.

In one embodiment of the invention the number of taps on each impedance string corresponding to the LSBs corresponds to the number of impedance means in the impedance string, the taps being defined by the junctions of adjacent impedance means in the said impedance string and by one end of the impedance string.

In another embodiment of the invention the number of taps to each impedance string corresponding to the MSBs is equal to the number of impedance means plus one in the said impedance string, the respective taps being defined by the junctions of adjacent impedance means of the said impedance string and by the respective ends of the said impedance string.

In one embodiment of the invention, each impedance means of the respective first and second outer impedance strings is provided by a resistor.

In one embodiment of the invention, each impedance means of the inner impedance string is provided by a resistor.

In a further embodiment of the invention the control means alters the switching pattern of each outer switch network in response to a change in the input digital signal in respective make-before-break sequences.

In another embodiment of the invention the control means alters the switching pattern of the outer switch networks in response to a change in the input digital signal by first increasing the total resistance between the reference voltage terminals and then restoring the total resistance to the substantially constant value.

In a further embodiment of the invention the control means alters the switching pattern of the outer switch networks in response to a change in the digital input signal by first altering the outer switch network corresponding to the outer impedance string that results in an increase in the total impedance between the reference voltage terminals, and then altering the switch pattern of the outer switch network corresponding to the other outer impedance string.

Advantageously, the control means comprises a decoder.

Advantages of the Invention

The advantages of the invention are many. A particularly important advantage of the DAC according to the invention is that any non-linearity error caused by the on-resistance of the first and second outer switch means is minimised. Since the first and second outer switch means are connected directly to one or other of the voltage reference terminals, the outer switch means are subjected to the voltage levels appearing on the respective corresponding reference terminals, and therefore the on-resistance of the respective first and second outer switch means is unaffected by code change of the input signal. Accordingly, where the output analog voltage corresponding to the MSBs is derived from the first and second outer impedance strings the differential non-linearity of the output voltage as the voltage is transitioning from one MSB to the next is virtually eliminated. Accordingly, since variation in the on-resistance of the outer switch means due to voltage variation is substantially avoided the first and second outer switch means may be provided by significantly smaller devices than heretofore, thus, minimising the space taken up by the first and second outer switch means on an integrated circuit chip. Additionally, by virtue of the fact that the first and second outer switch means are connected directly to the respective reference voltage terminals the dominant error term due to the on-resistance of the respective first and second outer switch means appears in the low voltage analog voltage output and the high analog voltage output.

The invention and its advantages will be readily apparent from the following description of some preferred embodiments thereof, which are given by way of example only, with reference to the accompanying drawings.

DETAILED DESCRIPTION OF THE INVENTION

Figure 1:
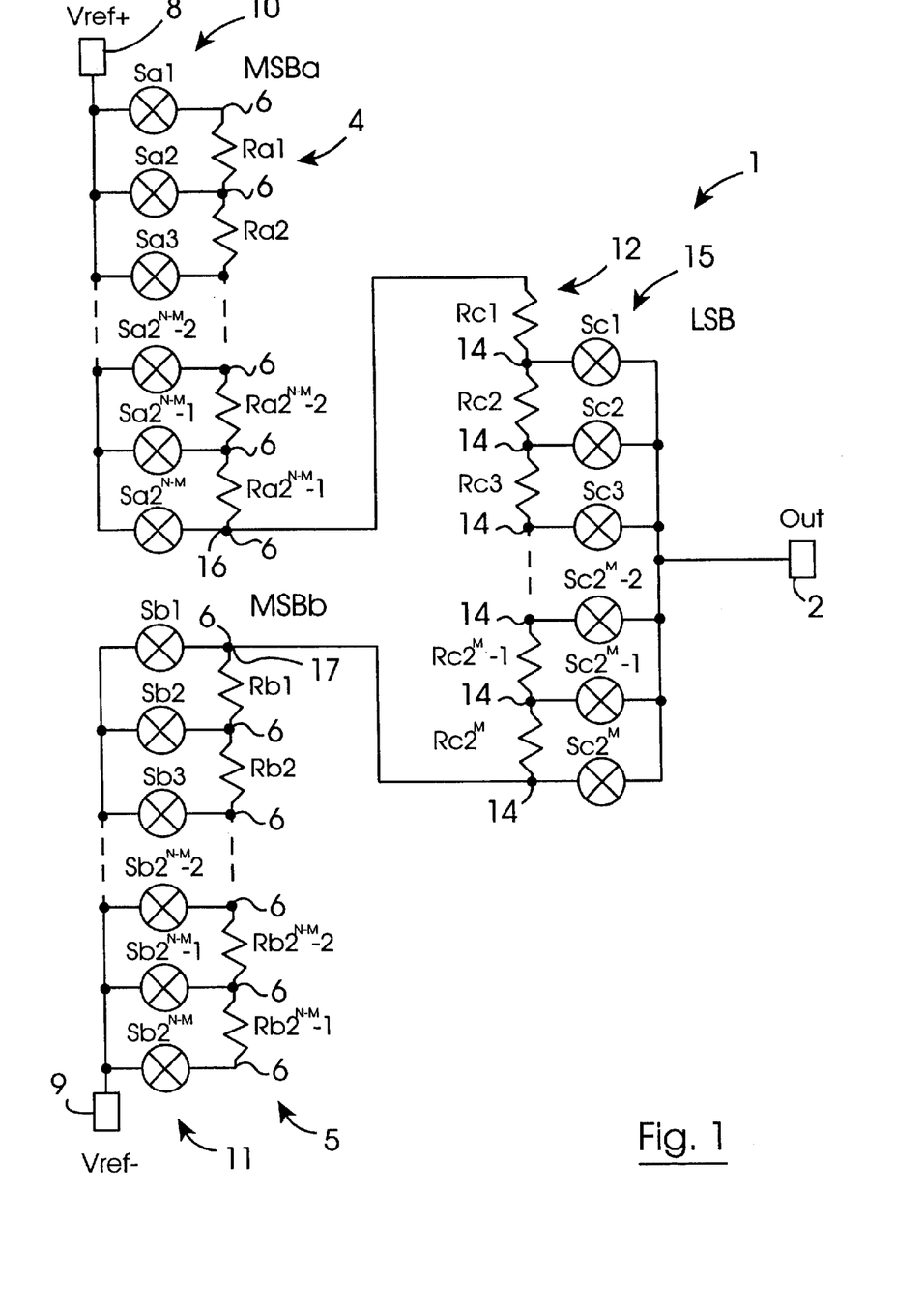
FIG. 1 is a schematic diagram of an N-bit DAC according to the invention.
Figure 2:
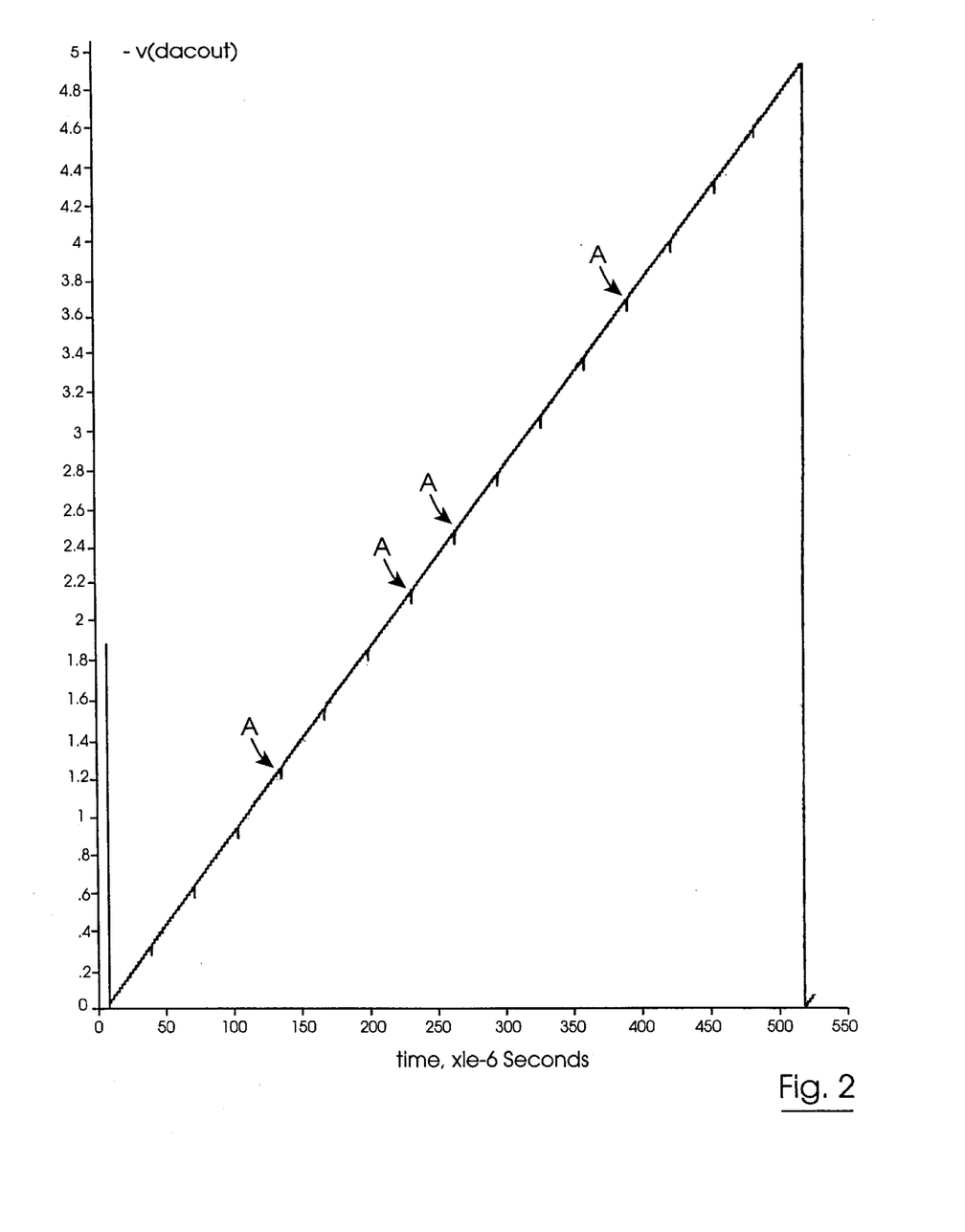
FIG. 2 is a graphical representation of the analog output voltage over the entire voltage range of an eight bit DAC.

Referring to the drawings, and initially to FIG. 1, there is illustrated a voltage-scaling N-bit DAC according to the invention indicated generally by the reference numeral 1 for converting an N-bit digital input signal to an analog voltage output signal which is developed on an output terminal 2. The DAC 1 comprises first and second outer impedance strings 4 and 5, respectively, of respective series connected impedance means, namely, substantially identical resistors Ra and Rb. The first and second outer strings 4 and 5 of resistors Ra and Rb, respectively, define a plurality of input taps 6 which may be selectively coupled to corresponding reference voltage terminals 8 and 9, respectively, by respective first and second outer switch means, namely, first and second outer switch networks 10 and 11 of discrete switches Sa and Sb, respectively. The input taps 6 are defined by the junctions of adjacent resistors Ra and adjacent resistors Rb, and also by the ends of the outer strings 4 and 5. A reference voltage $V_{ref}$ is applied across the terminals 8 and 9, the terminal 8 being the high terminal $V_{ref+}$ and the terminal 9 being the low terminal $V_{ref-}$. An inner impedance string 12 of respective series connected impedance means, namely, substantially identical resistors Rc is connected in series with and between the respective first and second outer strings 4 and 5 at junctions 16 and 17, The inner string 12 defines a plurality of output taps 14, and an inner switch means, namely, an inner switch network 15 of discrete switches Sc selectively couples the output terminal 2 to a selected one of the output taps 14. The output taps 14 are defined by the junctions between adjacent resistors Rc and one end of the inner string 12.

The switches Sa and Sb of first and second outer switch networks 10 and 11 are selectively operable as will be described below for connecting selected portions of the outer strings 4 and 5 across the reference voltage terminals 8 and 9 for decrementing the voltage at the junctions 16 and 17 to correspond to the MSBs of the digital input signal. The switches Sc of the inner switch network 15 are selectively operable for decrementing the component of the voltage on the output terminal 2 developed by the inner string 12 to correspond to the LSBs of the digital input signal. Thus, the outer strings 4 and 5 correspond to the MSBs, while the inner string 12 corresponds to the LSBs.

In this embodiment of the invention, the strings 4, 5 and 12 are arranged to convert the N-bit digital input signal with M LSBs and N-M MSBs. The inner string 12 comprises $2^M$ resistors Rc, namely, resistors Rc1 to Rc$2^M$, which define $2^M$ output taps 14. The inner switch network 15 comprises $2^M$ switches Sc, namely, switches Sc1 to Sc$2^M$ which correspond to the resistors Rc1 to Rc$2^M$ for selectively coupling the output terminal 2 to the output taps 14 for decrementing the voltage across the voltage on the output terminal 2 in $2^M$ decrements of voltage corresponding to Rc, each decrement corresponding to one LSB. The switches Sc are substantially identical to each other with substantially similar on-resistance values.

Since the number of MSBs of the digital input signal is N-M, the number of resistors Ra and Rb provided in each of the respective first and second outer strings 4 and 5 is $2^{N-M}-1$, namely, resistors Ra1 to Ra$2^{N-M}-1$ and Rb1 to Rb$2^{N-M}-1$. The respective first and second outer switch networks 10 and 11, each comprise $2^{N-M}$ switches, namely, switches Sa1 to Sa$2^{N-M}$ and Sb1 to Sb$2^{N-M}$. The switches Sa and Sb are substantially identical to each other with substantially similar on-resistance values. The switches Sa and Sb are operable for selectively connecting selected portions of the respective outer strings 4 and 5 in series with the inner string 12 across the reference voltage terminals 8 and 9. Additionally, the switches Sa and Sb are controlled so that only one of the switches Sa and one of the switches Sb are closed while the remaining switches Sa and Sb are open, namely, corresponding switches Sa and Sb are closed in the respective switch networks 10 and 11. In other words, when the switch Sa1 is closed, the switch Sb1 is closed, and when the switch Sa2 is closed, the switch Sb2 is closed, and so on, up to the switches Sa$2^{N-M}$ and Sb$2^{N-M}$. In this way, the number of the resistors Ra and Rb and the sum of the resistance values of the resistors Ra and Rb of the portions of the outer strings 4 and 5 which are connected across the reference voltage terminals 8 and 9 remains constant for all switch selections of the outer networks 10 and 11. Thus, the voltage level applied to the respective junctions 16 and 17 of the Inner string 12 with the outer strings 4 and 5 can be decremented in $2^{N-M}-1$ decrements of voltage corresponding to R where R is the resistance value of each resistor Ra and Rb, and each decrement corresponds to one MSB.

The total resistance value of the inner string 12 is substantially equal to the value of one of the resistors Ra or Rb, namely the resistance value R, and accordingly, the value of each resistor Rc is thus equal to $\frac{1}{2^M} \times R$. Thus, the analog voltage on the output terminal can be decremented in voltage steps corresponding to $\frac{1}{2^M} \times R$ each of which corresponds to one LSB by successively connecting the output terminal 2 to the output taps 14 by the switches Sc1 to Sc$2^M$, respectively. Thus, the DAC 1 is capable of $2^N$ output levels in one LSB increments, with the lowest level equal to $V_{ref-}$ and the highest output level at one LSB below the $V_{ref+}$.

Alternatively, the switch Sc1 could be tapped from the other end of the resistor Rc1, and the switch Sc$2^M$ could be tapped from the junction between the resistors Rc$2^M$ and Rc$2^M-1$, thus yielding an output swing from one LSB above $V_{ref-}$ to $V_{ref+1}$, although, the arrangement illustrated in FIG. 1 produces a more conventional output range.

As discussed above, the switches Sa and Sb are controlled so that only one of the switches Sa in the first outer switch network 10 and only one of the switches Sb in the second outer network 11 are closed and all the remaining switches Sa and Sb are open for each value of the digital input signal, and furthermore, only corresponding switches Sa and Sb are closed, in other words, when the switch Sa1 is closed, the switch Sb1 is closed, and so on. Accordingly, for all values of the digital input signal, the total number of resistors Ra and Rb of the first and second outer strings 4 and 5 which are connected across the reference voltage terminals 8 and 9 is always $2^{N-M}-1$ resistors. Since the total resistance value of the inner string 12 is R, the total value of the resistance switched across the reference voltage terminals 8 and 9 is $2^{N-M}R$ for all switch selections of the first and second outer switch networks 10 and 11. Thus, for any given digital input signal value, there will be a total of $2^{N-M}-1$ resistors of resistance value R, and $2^M$ resistors of resistance value $R/2^M$ giving a total resistance of $2^{N-M}R$ connected across the reference voltage terminals 8 and 9.

Accordingly, the DAC 1 comprises all the advantages of the DAC described in U.S. Pat. No. 5,495,245 in that the number of resistors and corresponding switches required is significantly reduced as opposed to single string DACs. Additionally, by virtue of the fact that the switches Sa and Sb which select the respective portions of the first and second outer strings 4 and 5, to be connected in series with the inner string 12 to the reference voltage terminals 8 and 9 are provided between the reference voltage terminals 8 and 9 and the resistors Ra and Rb of the outer strings 4 and 5, linearity errors as the switches Sa and Sb are switched for altering the analog output voltage from one MSB to the next due to voltage variation on the switches is avoided. This results from the fact that all the switches Sa are subjected to the reference voltage $V_{ref+}$ and all the switches Sb are subjected to the reference voltage $V_{ref-}$. This, thus, permits the use of switches Sa and Sb which may have relatively higher on-resistance than would otherwise be acceptable. This, thus, leads to smaller space requirements on the integrated circuit chip. Additionally, the dominant error term due to the on-resistance of the switches Sa and Sb appears in the low analog voltage output, namely, $V_{ref-}$, and the high analog voltage output $V_{ref+}$ less the incremental voltage corresponding to one LSB. Since the required specification at the low and high analog voltage outputs are commonly wider than the general linearity specification over the range of analog voltage outputs between the high and low outputs, the use of switches Sa and Sb with relatively higher on-resistance can be tolerated than could be tolerated heretofore and thus, the size of the switches Sa and Sb can be significantly reduced. This, as discussed above also leads to a significant reduction in the die area required in an integrated circuit chip.

Figure 3:
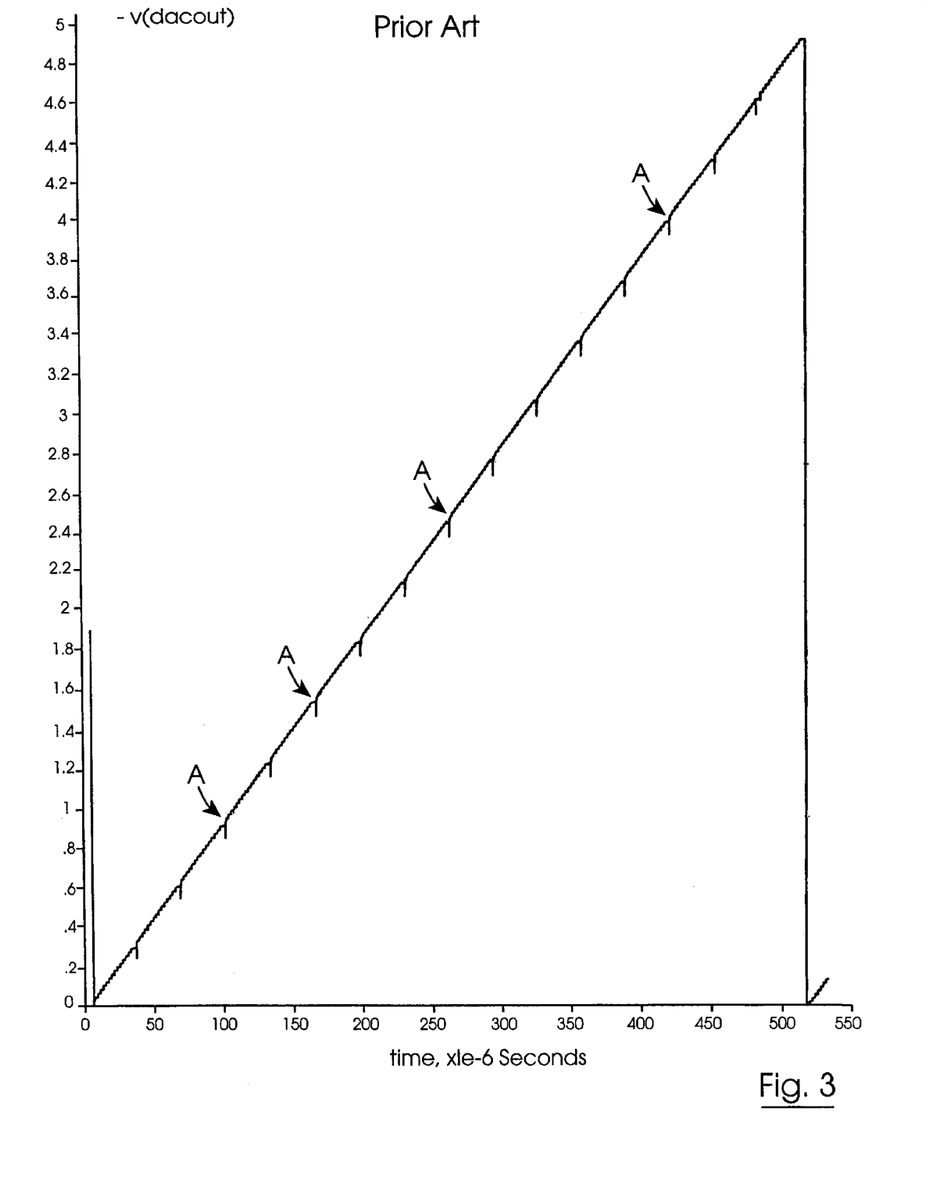
FIG. 3 is a graphical representation similar to FIG. 2 of the analog voltage output of an eight bit prior art DAC.
Figure 4:
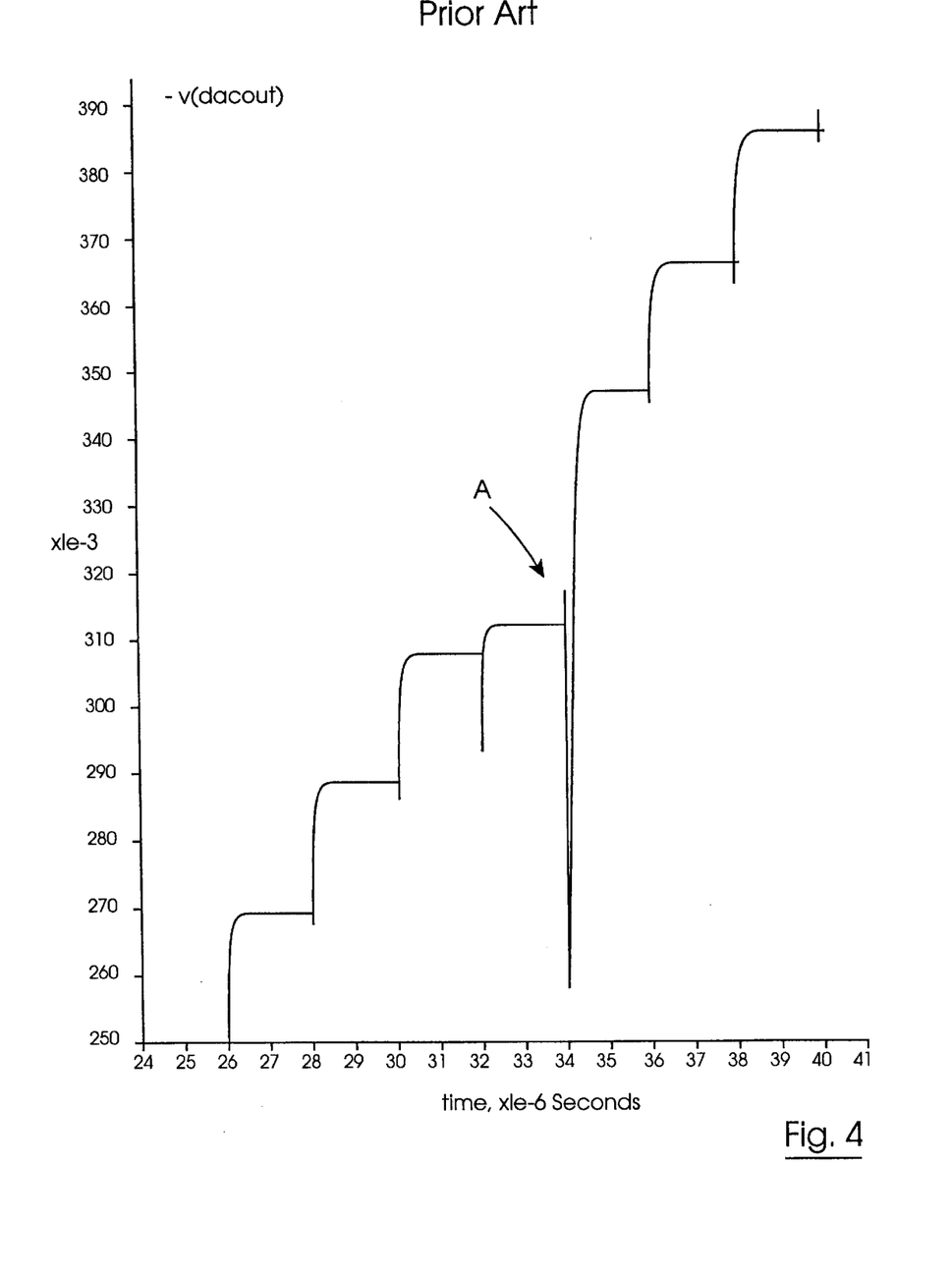
FIG. 4 is an enlarged view of a portion of the graphical representation of FIG. 3.
Figure 5:
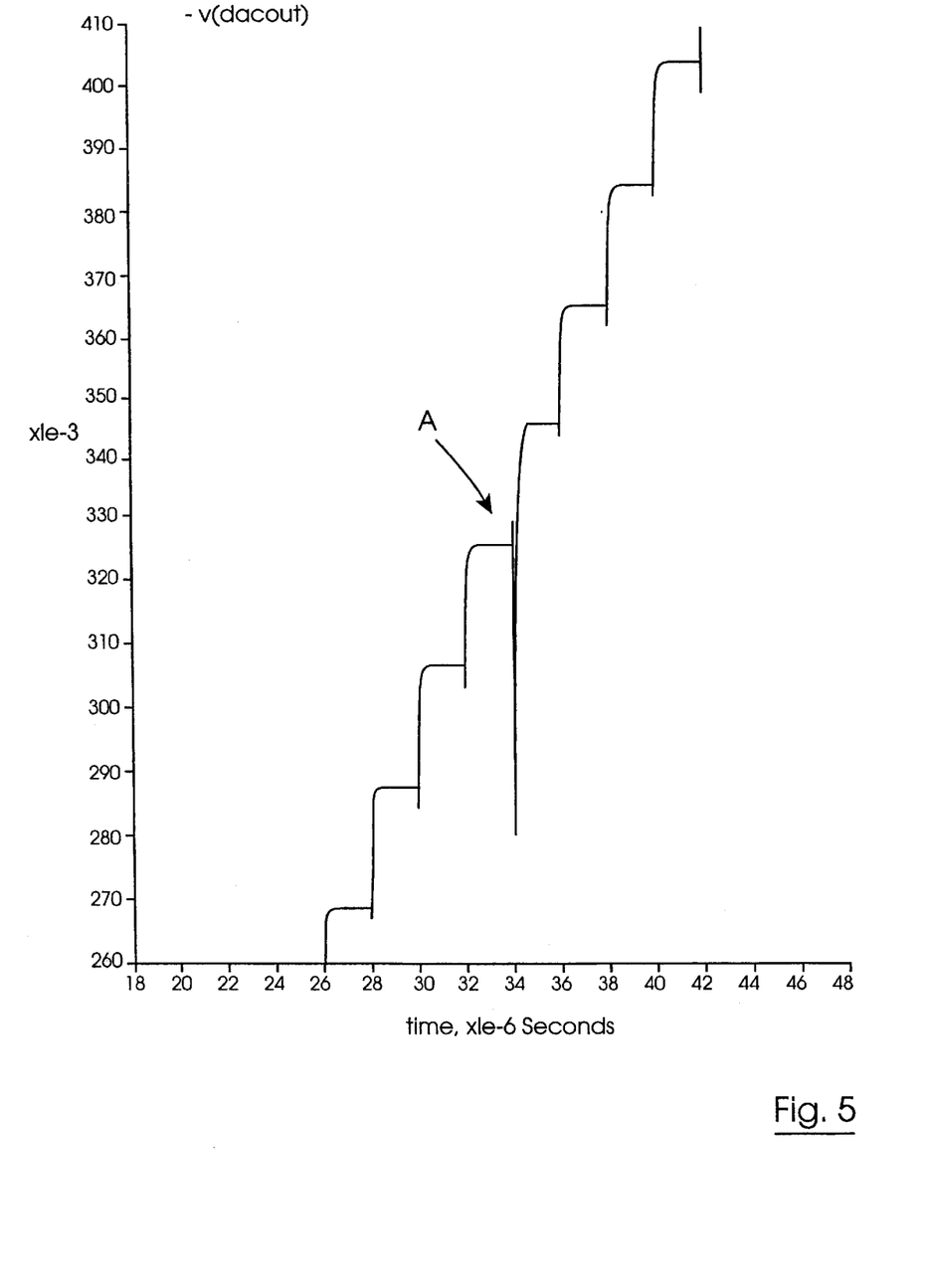
FIG. 5 is an enlarged view of the graphical representation of FIG. 2.

Referring now to FIGS. 2 to 5 the virtual elimination of the non-linearity caused by the switches Sa and Sb can be clearly seen. FIGS. 3 and 4 illustrate a plot of a typical analog output voltage of an eight bit prior art DAC according to U.S. Pat. No. 5,495,245. As can be seen the analog output voltage becomes non-linear at every $2^{N/2}$ transitions, in other words, when the outer switches corresponding to the switches Sa and Sb of the DAC according to the invention are being switched from one MSB to the next, points A of the graphs. This can be clearly seen in FIG. 4 which illustrates a transition from one MSB to the next, at point A. On the other hand, FIGS. 2 and 5 which illustrate a corresponding graphical representation of the analog output of an eight bit DAC according to the present invention show that the analog output is linear over the entire output voltage range from 0 volts to 5 volts. The transitions as the switches Sa and Sb switch the outer strings 4 and 5 from one MSB to the next is linear.

Figure 6:
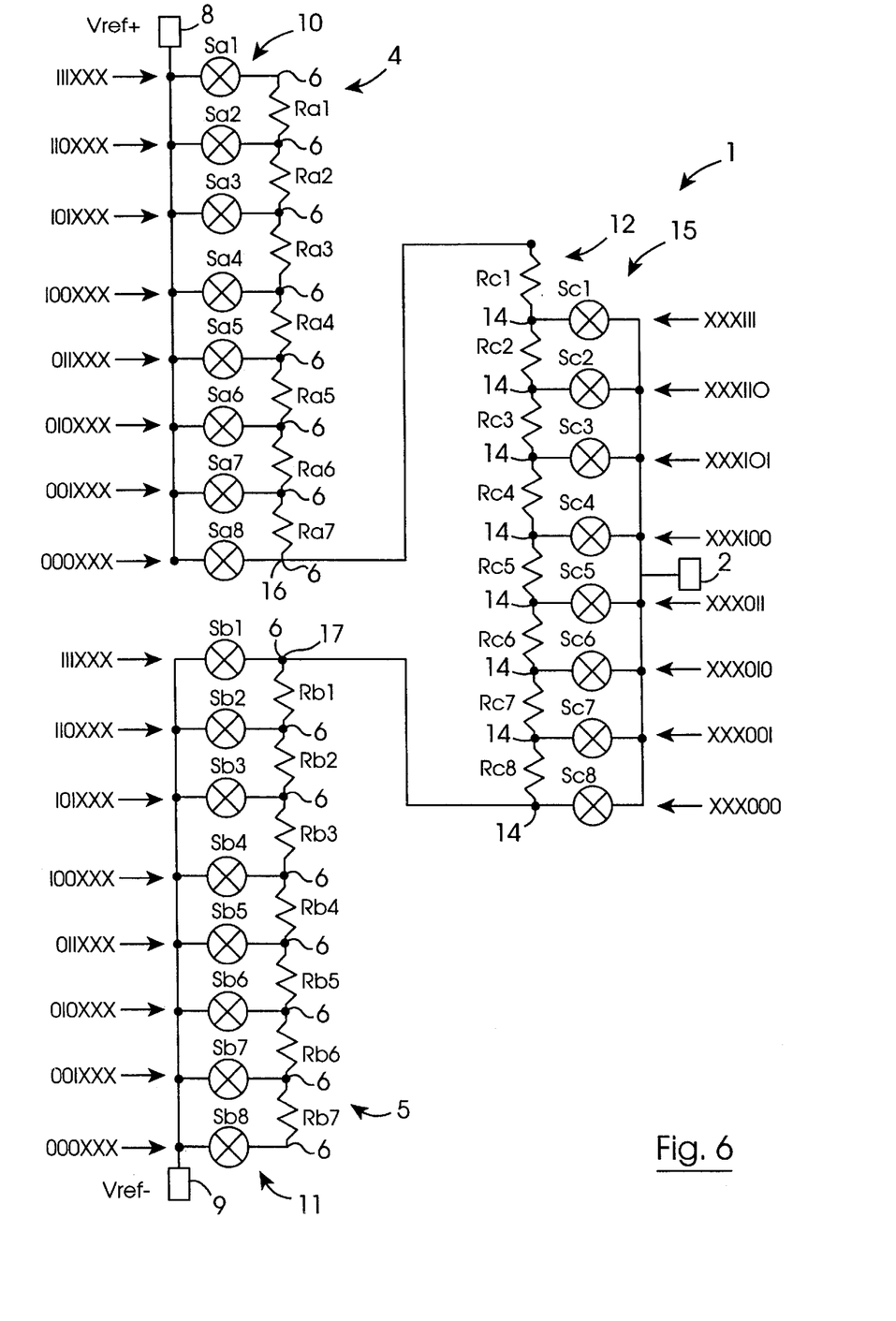
FIG. 6 is a schematic diagram of a six bit DAC also according to the invention.

The manner in which the switching is controlled to provide the DAC conversion function is illustrated in FIG. 6 for a six bit DAC. While the DAC 1 is most suitable for higher resolution digital inputs, a six bit DAC is described for simplicity of explanation and illustration. Additionally, for simplicity, the DAC 1 of FIG. 6 provides for three LSBs and three MSBs, the three LSBs corresponding to the inner string 12, and the three MSBs corresponding to the outer strings 4 and 5. Thus, N is equal to six and M is equal to three. The first and second outer strings 4 and 5 comprise resistors Ra1 to Ra7 and Rb1 to Rb7, respectively. The first and second outer switch networks 10 and 11 comprise switches Sa1 to Sa8, and Sb1 to Sb8, respectively. The inner string 12 comprises resistors Rc1 to Rc8, while the inner switch network comprises switches Sd1 to Sc8.

The three MSBs of the digital input signal are converted by the outer stings 4 and 5, while the three LSBs are converted by the inner string 12. The values of the MSBs and LSBs at which the respective switches Sa and Sb, and the switches Sc are closed are indicated by the binary numbers adjacent the corresponding switches Sa, Sb and Sc. For each LSB value of binary 111 of the six bit binary number, the switches Sa and Sb are switched for incrementing the voltage appearing at the junctions 16 and 17 an increment corresponding to one MSB. In other words, if, for example, the switches Sa6 and Sb6 had been closed, and the analog voltage were being incremented, the switches Sa5 and Sb5 would be next to be closed.

Figure 7:
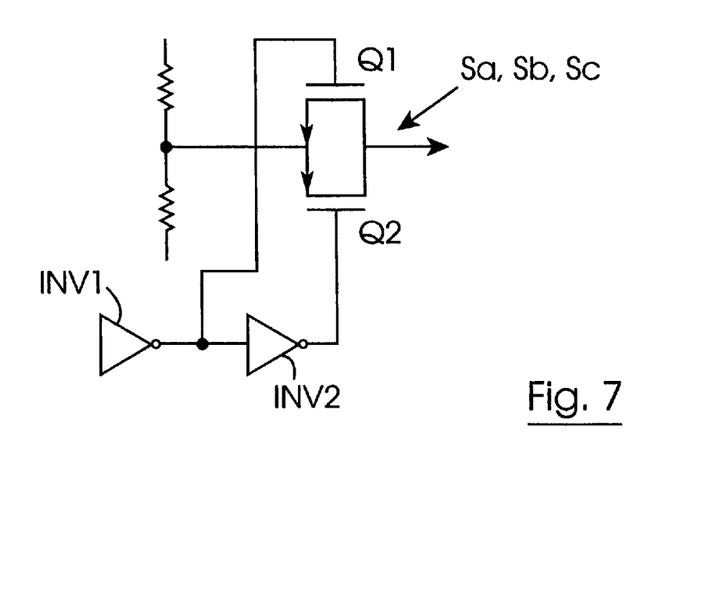
FIG. 7 is a circuit diagram of a switch for use with the DACs of FIGS. 1 and 6.

FIG. 7 illustrates one of the MOSFET switches which form the respective switches Sa, Sb and Sc. The switch of FIG. 7 comprises a first inverter INV1 which receives an input from the control means, namely, a decoder 20, described below with reference to FIG. 8. The first inverter INV1 provides an inverted signal to the gate of an n-channel CMOS transistor Q1, and to a second inverter INV2 which inverts the output of the first inverter INV1, and delivers a signal to the gate of a p-channel CMOS transistor Q2 which is connected in parallel with Q1, The respective sources and drains of Q1 and Q2 are shorted together to the corresponding tap on the corresponding resistor string, and to the corresponding reference voltage terminal or to the output terminal, as the case may be. The resulting switch has a very rapid response to changes in the decoder input.

The switching sequence adopted for the DAC 1 according to the invention is similar to that described for the DAC disclosed in U.S. Pat. No. 5,495,245 and the description of the switching sequence of the DAC of U.S. Pat. No. 5,495,245 is hereby incorporated by reference to the U.S. specification.

Figure 8:
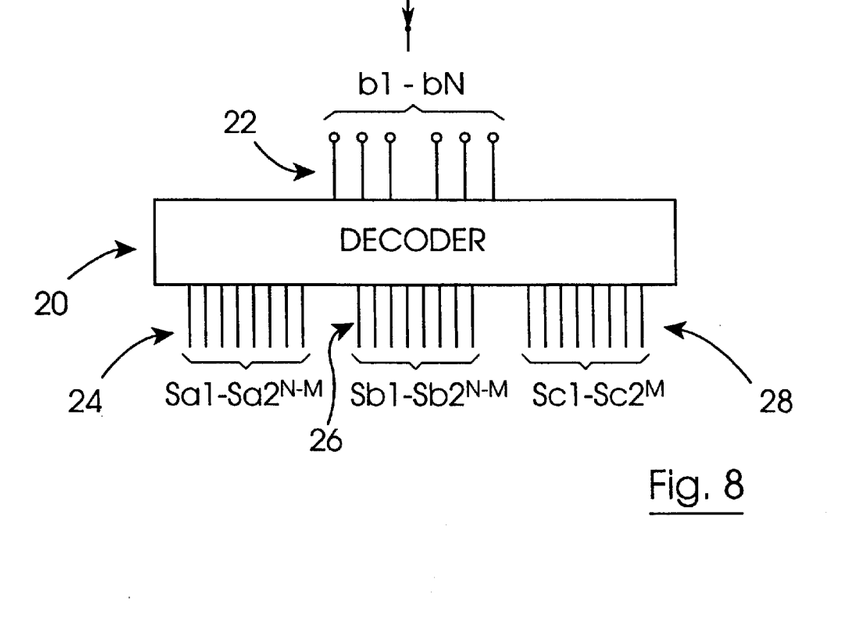
FIG. 8 is a block representation of a decoder for use with the DACs of FIGS. 1 and 6.

Referring now to FIG. 8 the decoder 20 comprises a series of inputs 22 for receiving bits b1 to bN of an N-bit digital input signal. The decoder 20 decodes the input signal into corresponding control signals for the switches Sa, Sb and Sc of the respective switch networks 10, 11 and 15 using conventional decoding techniques. One set of switch control outputs 24 is provided for switching the switches Sa1 to Sa$2^{N-M}$ of the first outer switch network 10. Another set of outputs 26 operate the switches Sb1 to Sb$2^{N-M}$ of the second outer switch network 11, while a third set 28 is provided for operating the switches Sc1 to Sc$2^M$ of the inner switch network 15.

Figure 9:
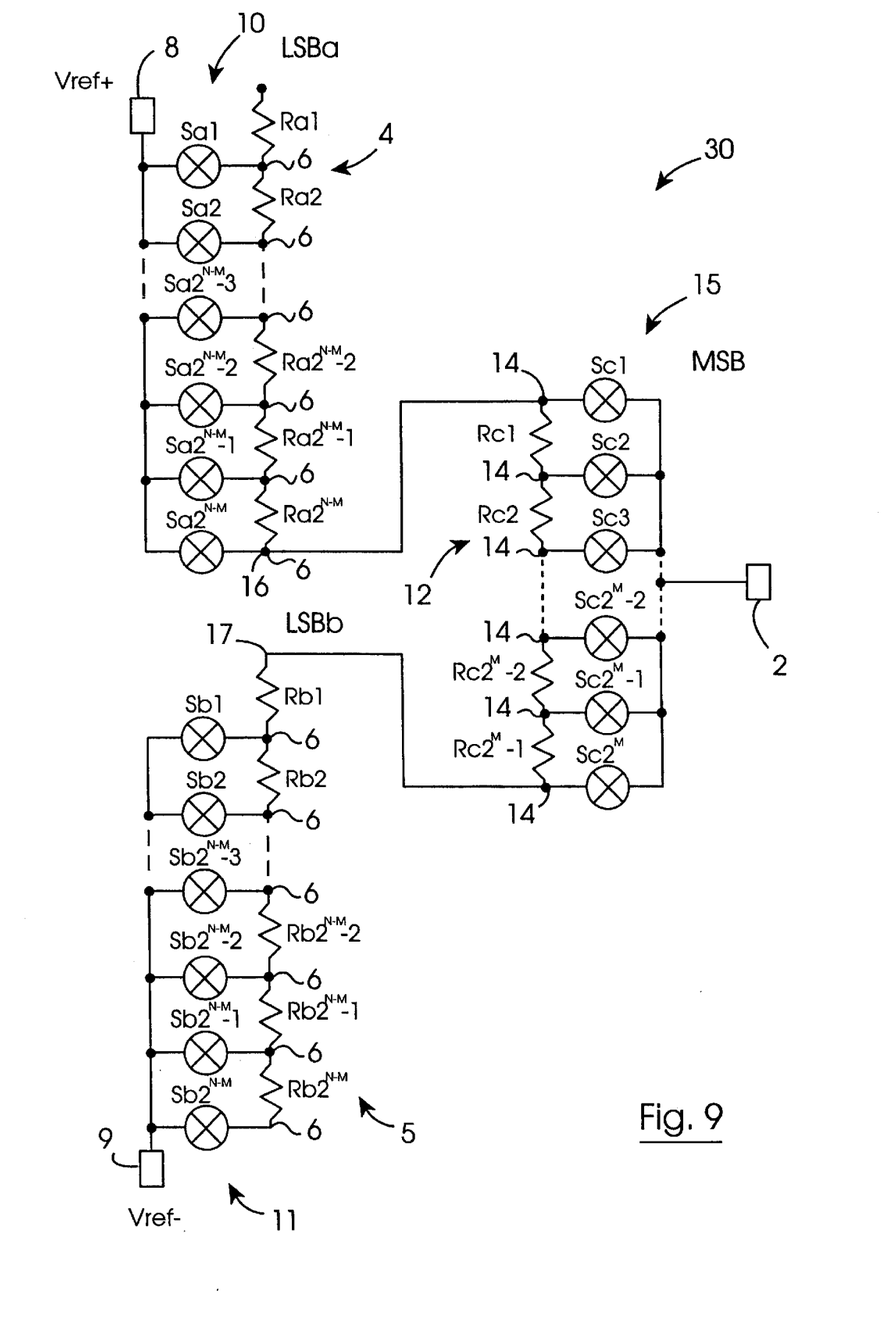
FIG. 9 is a schematic diagram of an N-bit DAC according to another embodiment of the invention.

Referring now to FIG. 9, an N-bit DAC according to another embodiment of the invention which is indicated generally by the reference numeral 30 is illustrated. The DAC 30 is substantially similar to the DAC 1, and similar components are identified by the same reference numerals. The main difference between the DAC 30 and the DAC 1 is that the inner string 12 corresponds to the MSBs, while the first and second outer strings 4 and 5 correspond to the LSBs. Thus, the inner string 12 decodes the MSBs, while the outer strings decodes the LSBs. In this embodiment of the invention, the inner string decodes M MSBs, while the outer string decode (N−M) LSBs. The value of the resistors Rc are each of value R, while the value of the resistors Ra and Rb are each of value $R/2^{N-M}$. The advantages achieved by the DAC 1 are similarly achieved by the DAC 30 since the on-resistance of the switches Sa and Sb still appear only at the respective low and high analog voltage output values.

While the switches of the first and second outer switch networks and the inner switch network have been described as being P and N-type MOSFETs driven in anti-phase, the switches may be single type MOSFET switches, and needless to say, any other suitable switches may be used. Indeed, a mix of different types of switches may be used, for example, one type of switch may be used for the switches of the inner switch network, while a different type of switch may be used for the switches of the respective first and second outer switch networks.

What is claimed is:

1. A digital-to-analog converter (DAC) for converting an N-bit digital input signal comprising:
    a pair of voltage reference terminals for receiving a reference voltage,
    an analog output terminal on which an analog output voltage derived from the reference voltage is developed corresponding to the digital input signal,
    first and second separate outer impedance strings of respective series connected impedance elements defining a plurality of input taps,
    first and second outer switch networks corresponding to the first and second outer impedance strings for selectively coupling a selected one of the input taps of the corresponding one of the first and second outer impedance strings to a corresponding one of the reference voltage terminals,
    an inner impedance string of series connected impedance elements defining a plurality of output taps, the inner impedance string being connected in series with and between the respective first and second outer impedance strings,
    an inner switch network for selectively coupling the output terminal to a selected one of the output taps, and
    a control circuit responsive to the digital input signal for controlling the first and second outer switch networks for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal.

2. A DAC as claimed in claim 1 in which each of the first and second switch networks comprises a plurality of outer discrete switches, the number of switches in the respective outer switch networks corresponding to the number of input taps in the corresponding outer impedance string for individually coupling the respective corresponding input taps to the corresponding reference voltage terminal.

3. A DAC as claimed in claim 2 in which the switches of the respective first and second outer switch networks are substantially identical to each other in the respective switch networks.

4. A DAC as claimed in claim 2 in which the switches of the respective first and second outer switch networks are all substantially identical to each other.

5. A DAC as claimed in claim 2 in which each switch of the respective first and second outer switch networks is provided by a P-type MOSFET and an N-type MOSFET driven in anti-phase.

6. A DAC as claimed in claim 2 in which each switch of the respective first and second outer switch networks is provided by a single MOSFET type device.

7. A DAC as claimed in claim 1 in which the respective first and second outer impedance strings each comprise equal numbers of impedance elements, of substantially equal impedance values.

8. A DAC as claimed in claim 1 in which the impedance elements of the inner impedance string are of substantially equal impedance values.

9. A DAC as claimed in claim 1 in which the inner switch network comprises a plurality of discrete switches, the number of discrete switches corresponding to the number of output taps on the inner impedance string for individually coupling the respective output taps to the output terminal.

10. A DAC as claimed in claim 9 in which the switches of the inner switch network are substantially identical to each other.

11. A DAC as claimed in claim 9 in which each switch of the inner switch network is provided by a P-type MOSFET and an N-type MOSFET driven in anti-phase.

12. A DAC as claimed in claim 9 in which each switch of the inner switch network is provided by a single MOSFET type device.

13. A DAC as claimed in claim 1 in which each impedance string which corresponds to the LSBs comprises $2^M$ impedance elements, where M is the number of least significant bits in the digital input signal.

14. A DAC as claimed in claim 13 in which each impedance string which corresponds to the MSBs comprises $2^{(N-M)}-1$ impedance elements, where N is the number of bits in the digital input signal.

15. A DAC as claimed in claim 14 in which the impedance value of each impedance element in each impedance string corresponding to the LSBs is $\frac{1}{2}^M$ of the impedance value of each impedance element in each impedance string corresponding to the MSBs.

16. A DAC as claimed in claim 1 in which the number of taps on each impedance string corresponding to the LSBs corresponds to the number of impedance elements in the impedance string, the taps being defined by the junctions of adjacent impedance elements in the said impedance string and by one end of the impedance string.

17. A DAC as claimed in claim 1 in which the number of taps to each impedance string corresponding to the MSBs is equal to the number of impedance elements plus one in the said impedance string, the respective taps being defined by the junctions of adjacent impedance elements of the said impedance string and by the respective ends of the said impedance string.

18. A DAC as claimed in claim 1 in which each impedance element of the respective first hand second outer impedance strings is provided by a resistor.

19. A DAC as claimed in claim 1 in which each impedance element of the inner impedance string is provided by a resistor.

20. A DAC as claimed in claim 2 in which the control circuit alters the switching pattern of each outer switch network in response to a change in the digital input signal in respective make-before-break sequences.

21. A DAC as claimed in claim 2 in which the control circuit alters the switching pattern of the outer switch networks in response to a change in the digital input signal by first increasing the total resistance between the reference voltage terminals and then restoring the total resistance to the substantially constant value.

22. A DAC as claimed in claim 2 in which the control circuit alters the switching pattern of the outer switch networks in response to a change in the digital input signal by first altering the outer switch network corresponding to the outer impedance string that results in an increase in the total impedance between the reference voltage terminals, and then altering the switch pattern of the outer switch network corresponding to the other outer impedance string.

23. A DAC as claimed in claim 1 in which the control circuit comprises a decoder.

24. A digital-to-analog converter (DAC) for converting an N-bit digital input signal comprising:

a pair of voltage reference terminals for receiving a reference voltage, an analog output terminal on which an analog output voltage derived from the reference voltage is developed corresponding to the digital input signal, first and second separate outer impedance strings of respective series connected impedance elements defining a plurality of input taps, the input taps of each impedance string being defined by the junctions between adjacent impedance elements in the impedance string and by at least one end of the impedance string, first and second outer switch networks corresponding to the first and second outer impedance strings for selectively coupling a selected one of the input taps of the corresponding one of the first and second outer impedance strings to a corresponding one of the reference voltage terminals, an inner impedance string of series connected impedance elements defining a plurality of output taps, the output taps being defined by the junctions of adjacent impedance elements in the impedance string and by at least one end of the impedance string, the inner impedance string being connected in series with and between the respective first and second outer impedance strings, an inner switch network for selectively coupling the output terminal to a selected one of the output taps, a control circuit responsive to the digital input signal for controlling the first and second outer switch networks for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal, and the number of taps in each impedance string corresponding to the LSBs being equal to the number of impedance elements in the impedance string.

25. A digital-to-analog converter (DAC) for converting an N-bit digital input signal comprising:

a pair of voltage reference terminals for receiving a reference voltage, an analog output terminal on which an analog output voltage derived from the reference voltage is developed corresponding to the digital input signal, first and second separate outer impedance strings of respective series connected impedance elements defining a plurality of input taps, the input taps of each impedance string being defined by the junctions between adjacent impedance elements in the impedance string and by at least one end of the impedance string, first and second outer switch networks corresponding to the first and second outer impedance strings for selectively coupling a selected one of the input taps of the corresponding one of the first and second outer impedance strings to a corresponding one of the reference voltage terminals, an inner impedance string of series connected impedance elements defining a plurality of output taps, the output taps being defined by the junctions of adjacent impedance elements in the impedance string and by at least one end of the impedance string, the inner impedance string being connected in series with and between the respective first and second outer impedance strings, an inner switch network for selectively coupling the output terminal to a selected one of the output taps, a control circuit responsive to the digital input signal for controlling the first and second outer switch networks for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal, and the number of taps in each impedance string corresponding to the MSBs being equal to the number of impedance elements in the impedance string plus one.

26. A digital-to-analog converter (DAC) for converting an N-bit digital input signal comprising:

a pair of voltage reference terminals for receiving a reference voltage, an analog output terminal on which an analog output voltage derived from the reference voltage is developed corresponding to the digital input signal, first and second separate outer impedance strings of respective series connected impedance elements defining a plurality of input taps, first and second outer switch networks corresponding to the first and second outer impedance strings for selectively coupling a selected one of the input taps of the corresponding one of the first and second outer impedance strings to a corresponding one of the reference voltage terminals, an inner impedance string of series connected impedance elements defining a plurality of output taps, the inner impedance string being connected in series with and between the respective first and second outer impedance strings, an inner switch network for selectively coupling the output terminal to a selected one of the output taps, and a control circuit responsive to the digital input signal for controlling the first and second outer switch networks for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal, the switching pattern of each outer switch network being altered by the control circuit in response to a change in the digital input signal in respective make-before-break sequences.

27. A digital-to-analog converter (DAC) for converting an N-bit digital input signal comprising:

a pair of voltage reference terminals for receiving a reference voltage, an analog output terminal on which an analog output voltage derived from the reference voltage is developed corresponding to the digital input signal, first and second separate outer impedance strings of respective series connected impedance elements defining a plurality of input taps, first and second outer switch networks corresponding to the first and second outer impedance strings for selectively coupling a selected one of the input taps of the corresponding one of the first and second outer impedance strings to a corresponding one of the reference voltage terminals, an inner impedance string of respective series connected impedance elements defining a plurality of output taps, the inner impedance string being connected in series with and between the respective first and second outer impedance strings, an inner switch network for selectively coupling the output terminal to a selected one of the output taps, and a control circuit responsive to the digital input signal for controlling the respective outer switch network for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal, the switching pattern of the outer switch networks being altered by the control circuit in response to a change in the digital input signal by first increasing the total resistance between the reference voltage terminals and then restoring the total resistance to the substantially constant value.

28. A digital-to-analog converter (DAC) for converting an N-bit digital input signal comprising:

a pair of voltage reference terminals for receiving a reference voltage, an analog output terminal on which an analog output voltage derived from the reference voltage is developed corresponding to the digital input signal, first and second separate outer impedance strings of respective series connected impedance elements defining a plurality of input taps, first and second outer switch networks corresponding to the first and second impedance strings for selectively coupling a selected one of the input taps of the corresponding one of the first and second outer impedance strings to a corresponding one of the reference voltage terminals, an inner impedance string of respective series connected impedance elements defining a plurality of output taps, the inner impedance string being connected in series with and between the respective first and second outer impedance strings, an inner switch network for selectively coupling the output terminal to a selected one of the output taps, and a control circuit responsive to the digital input signal for controlling the first and second outer switch networks for switching selectable portions of the corresponding first and second outer impedance strings with the inner impedance string between the reference voltage terminals and for controlling the inner switch network for switching the output terminal to one of the output taps of the inner impedance string so that a voltage is developed on the output terminal corresponding to the digital input signal, the aggregate resistance of the portions of the first and second outer impedance strings switched between the reference voltage terminals being substantially constant over the switching range, and the voltage level developed at the junction of the inner impedance string to one of the outer impedance strings corresponding to one of the most significant bits (MSBs) and the least significant bits (LSBs) of the digital input signal, and the voltage developed between the output terminal and the said junction of the inner impedance string with the said one of the outer impedance strings corresponding to the other of the MSBs and the LSBs of the digital input signal, the switching pattern of the outer switch networks being altered by the control circuit in response to a change in the digital input signal by first altering the outer switch network corresponding to the outer impedance string which results in an increase in the total impedance between the reference voltage terminals, and then altering the switch pattern of the outer switch network corresponding to the other outer impedance string.

* * * * *